(12) United States Patent  (10) Patent No.: US 7,470,142 B2
Lee  (45) Date of Patent: Dec. 30, 2008

(54) WAFER BONDING METHOD

(76) Inventor: Sang-Yun Lee, 17082 NW. Elk Run Dr., Beaverton, OR (US) 97006

( * ) Notice: Subject to any disclaimer, the term of this patent is extended or adjusted under 35 U.S.C. 154(b) by 276 days.

(21) Appl. No.: 11/092,498

(22) Filed: Mar. 29, 2005

(65) Prior Publication Data

US 2005/0280042 A1 Dec. 22, 2005

Related U.S. Application Data

(63) Continuation-in-part of application No. 10/873,969, filed on Jun. 21, 2004, now Pat. No. 7,052,941.

(51) Int. Cl.
*H01L 21/76* (2006.01)
(52) U.S. Cl. ..................................... 439/406
(58) Field of Classification Search ................ 438/455, 438/406, 118, 622, 623, 624; 257/782, 784
See application file for complete search history.

(56) References Cited

U.S. PATENT DOCUMENTS

| | | | | |
|---|---|---|---|---|
| 3,926,360 A | * | 12/1975 | Moister, Jr. | 228/180.21 |
| 4,732,312 A | * | 3/1988 | Kennedy et al. | 148/535 |
| 4,854,986 A | * | 8/1989 | Raby | 156/87 |
| 5,617,991 A | * | 4/1997 | Pramanick et al. | 228/180.22 |
| 6,153,495 A | * | 11/2000 | Kub et al. | 438/459 |
| 6,600,173 B2 | * | 7/2003 | Tiwari | 257/74 |
| 6,630,713 B2 | * | 10/2003 | Geusic | 257/347 |
| 6,933,205 B2 | * | 8/2005 | Matsuo et al. | 438/406 |
| 7,109,092 B2 | * | 9/2006 | Tong | 438/406 |
| 7,148,119 B1 | * | 12/2006 | Sakaguchi et al. | 438/406 |
| 7,205,625 B2 | * | 4/2007 | Nakamura et al. | 257/459 |
| 7,338,884 B2 | * | 3/2008 | Shimoto et al. | 438/459 |

* cited by examiner

*Primary Examiner*—Thao P. Le
(74) *Attorney, Agent, or Firm*—Schmeiser Olsen & Watts LLP

(57) ABSTRACT

A method of coupling substrates together includes steps of providing first and second substrates. The second substrate includes a conductive bonding region positioned on its surface. Heat is provided to the conductive bonding region to reduce its number of defects. The surface of the conductive bonding region is bonded to the first substrate so that the conductive bonding region and the first substrate are coupled together.

42 Claims, 16 Drawing Sheets

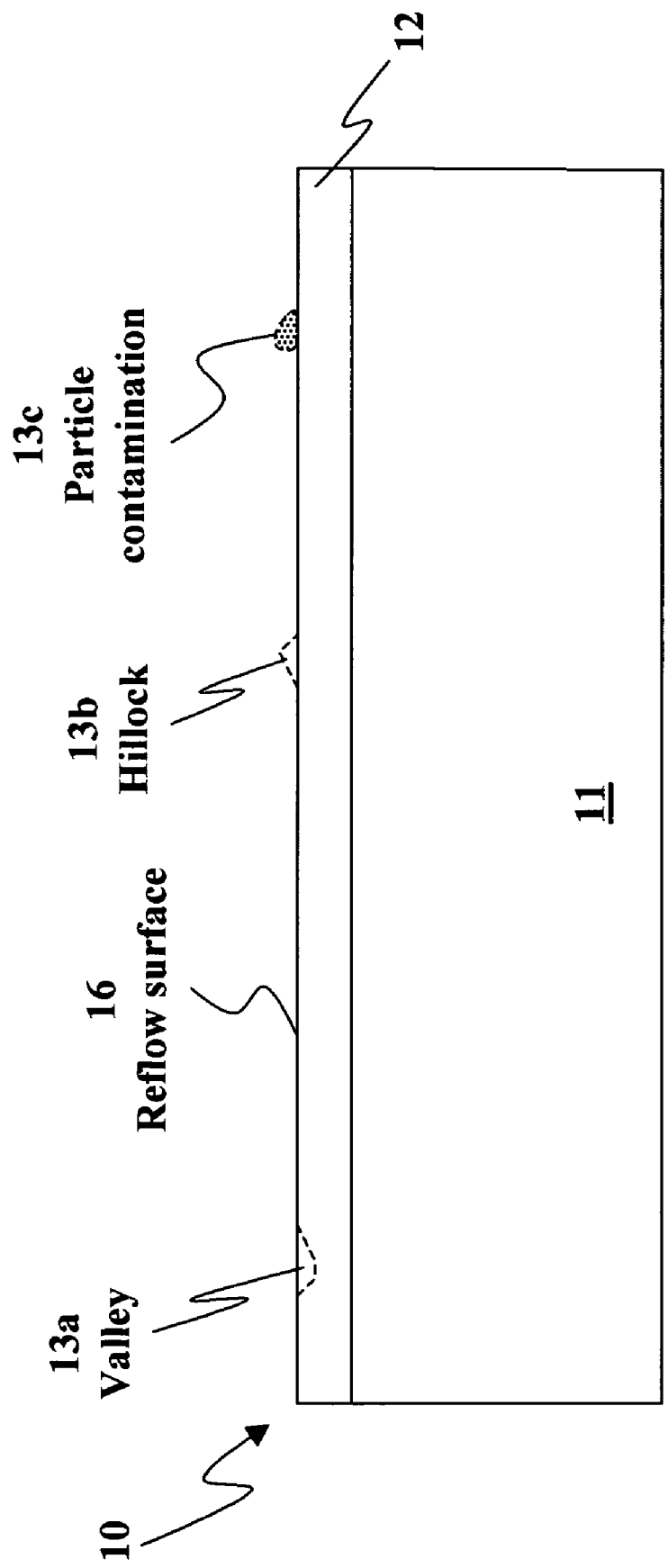

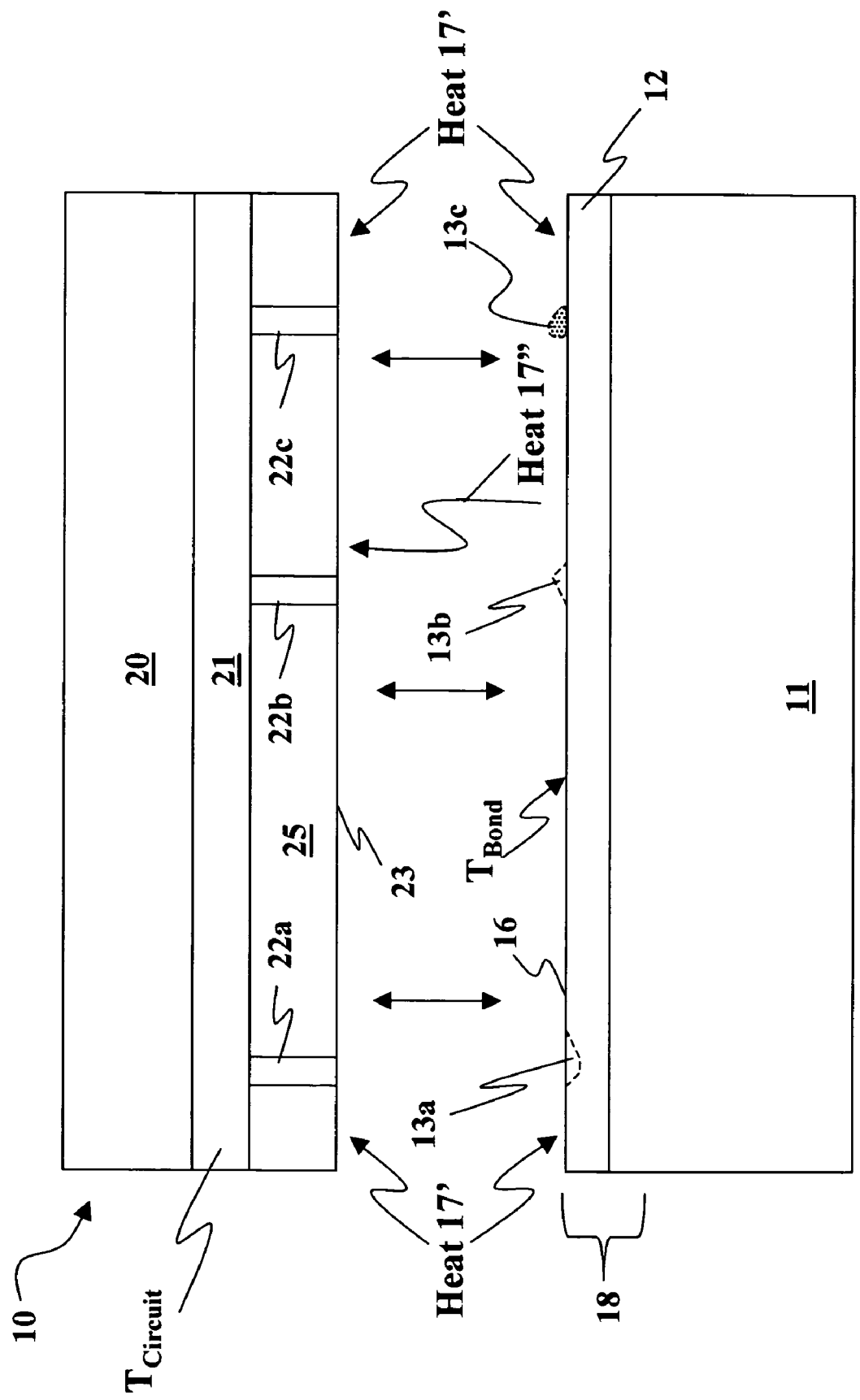

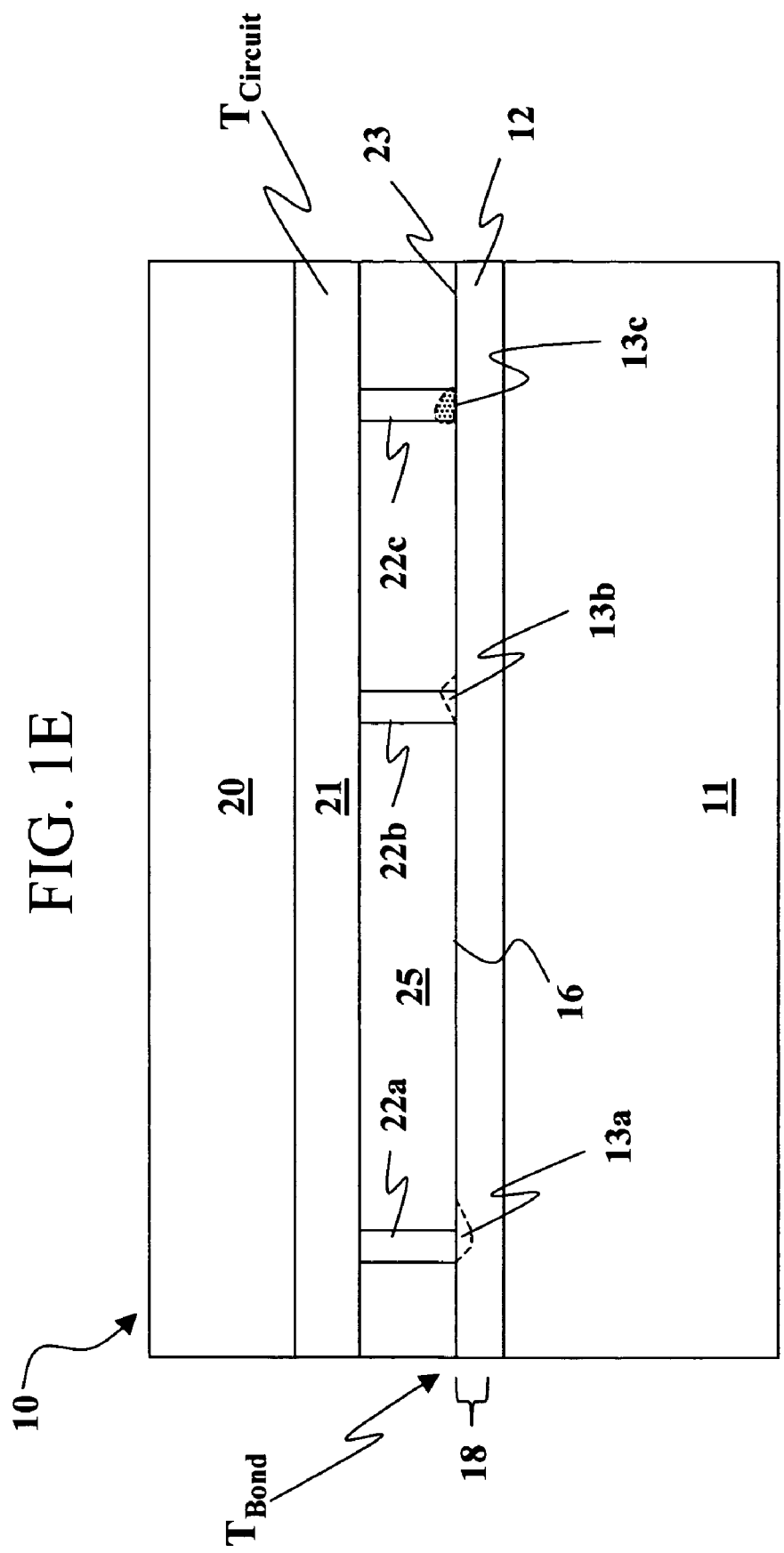

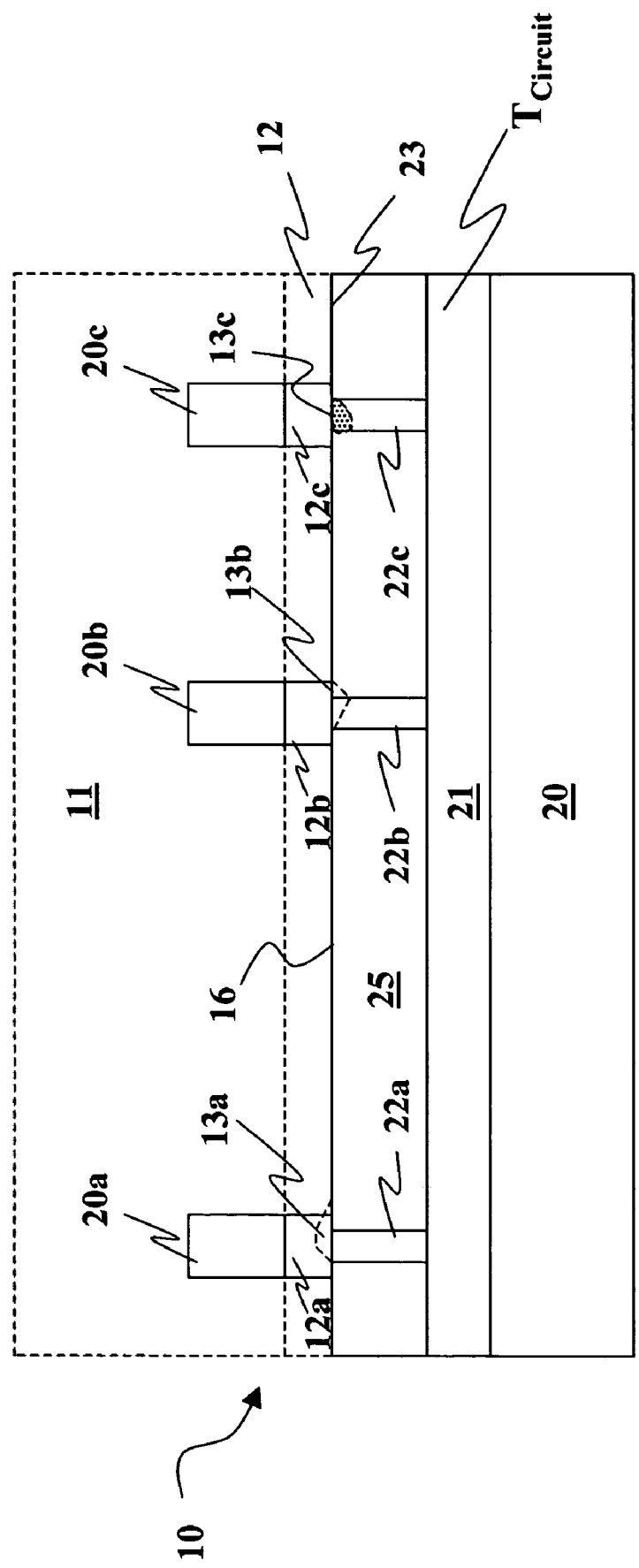

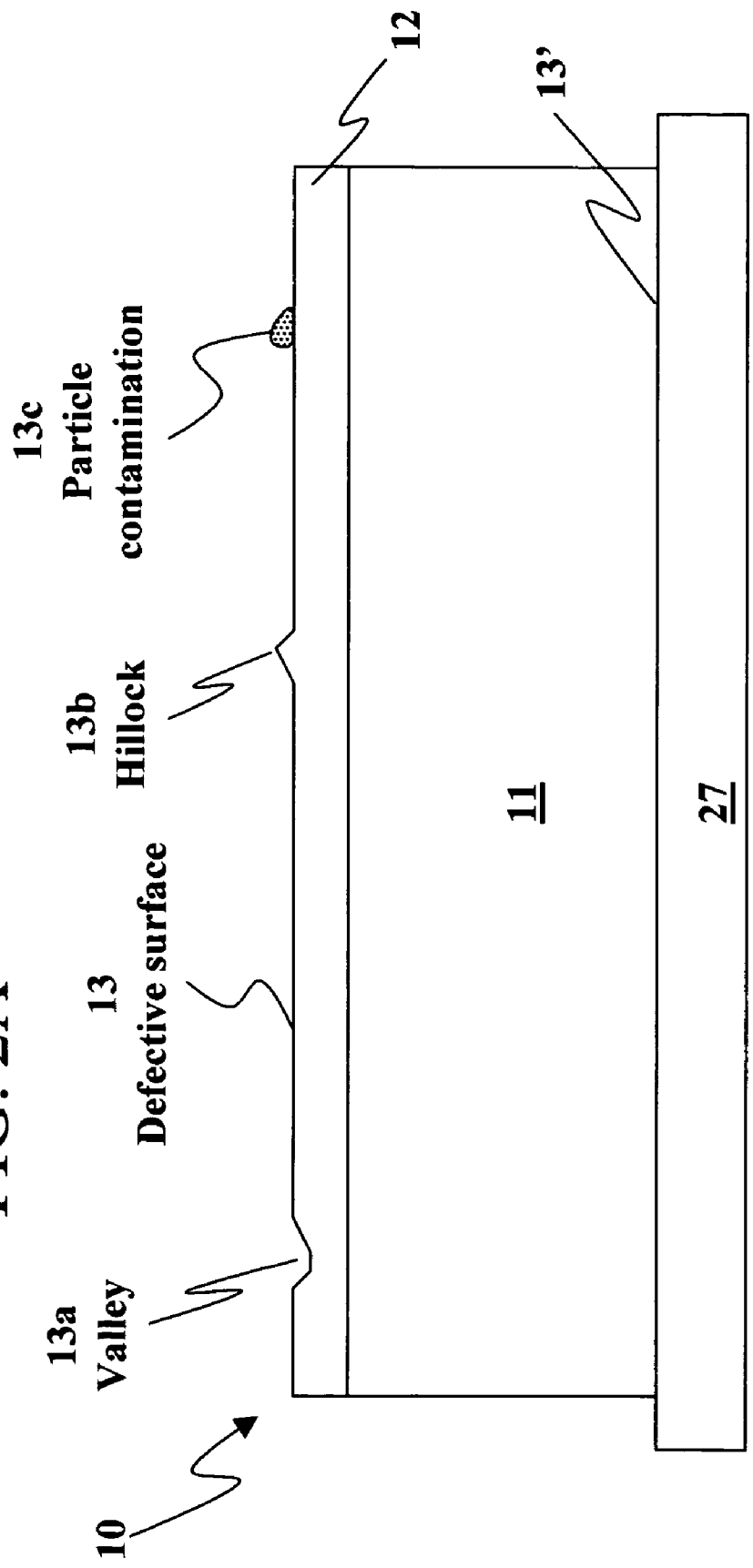

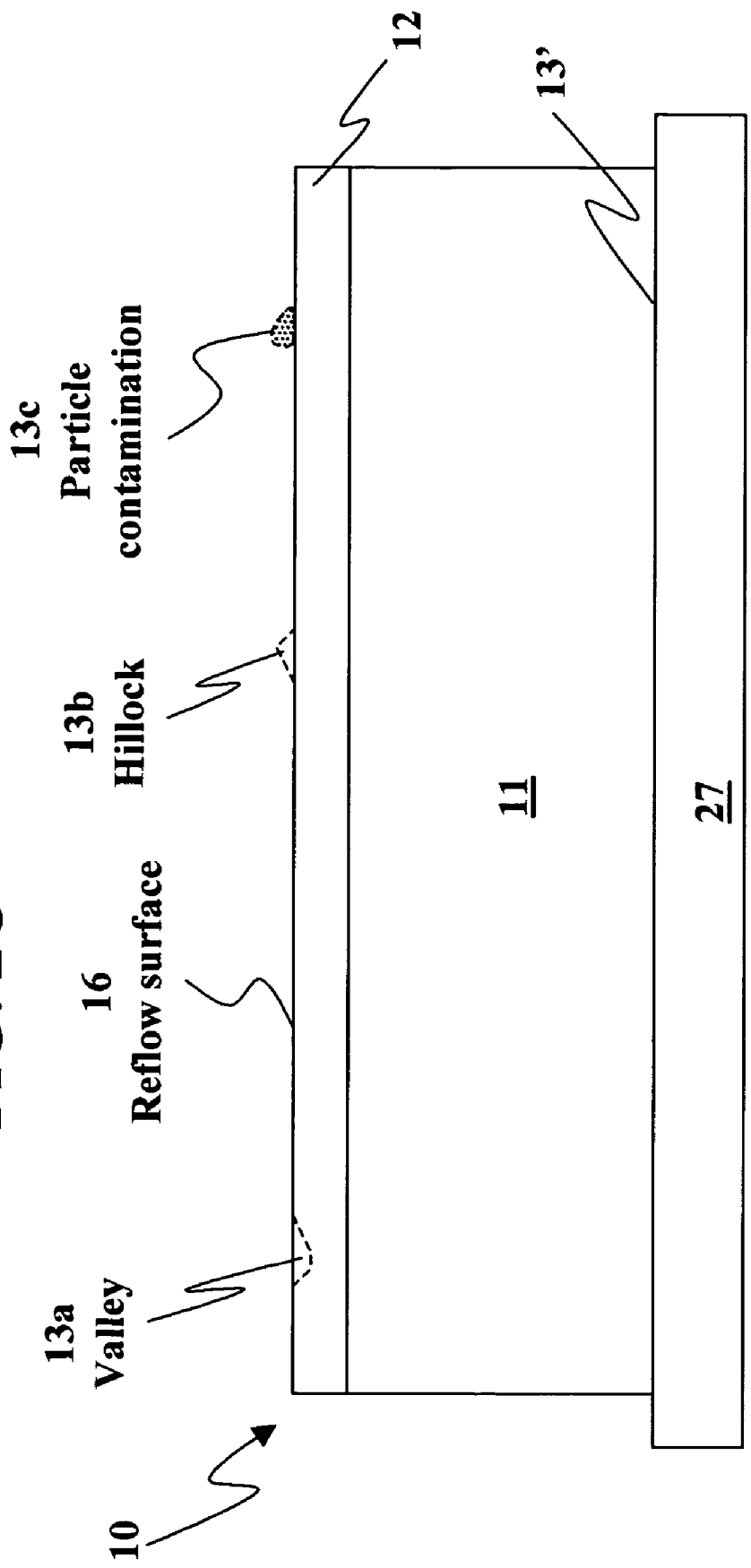

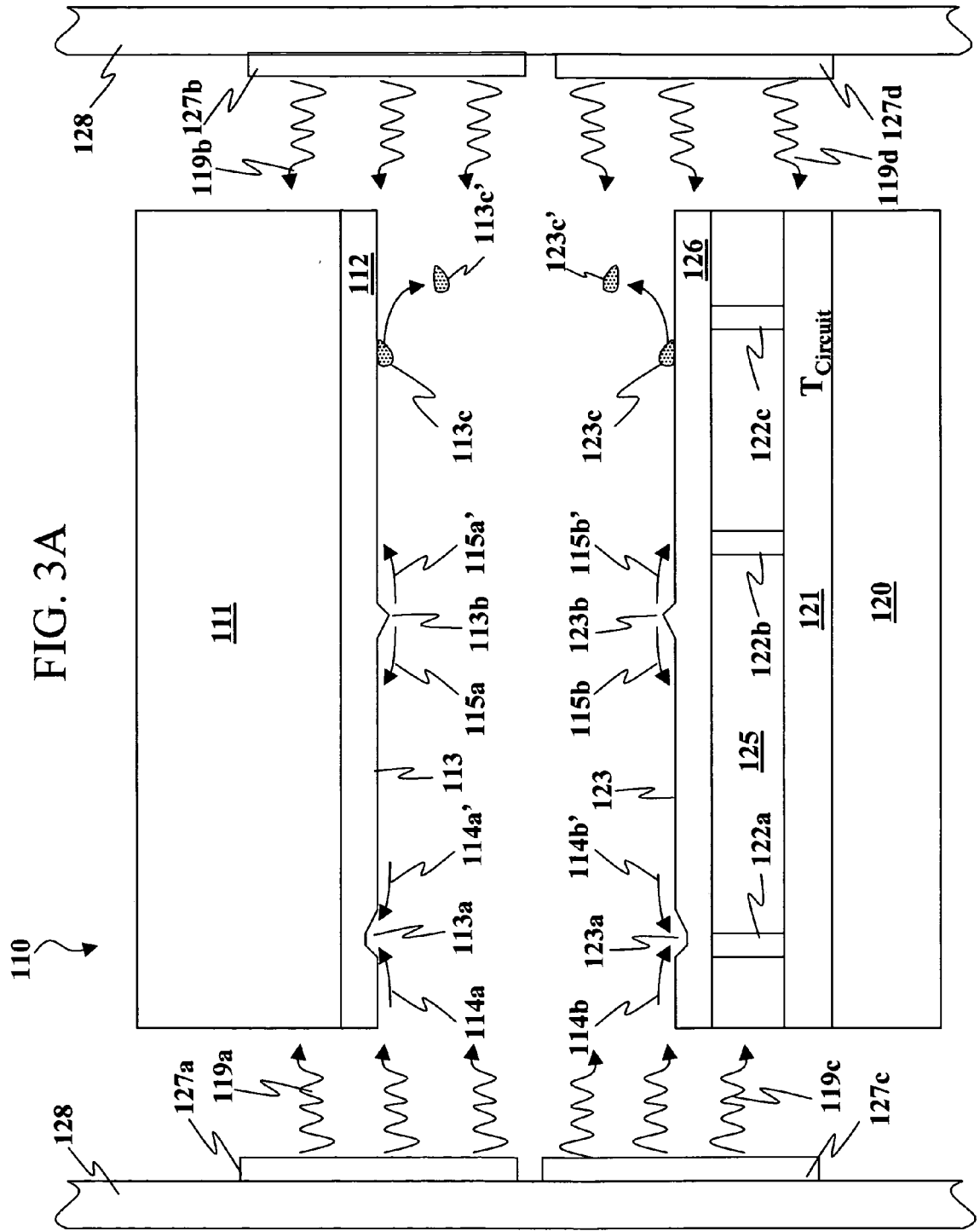

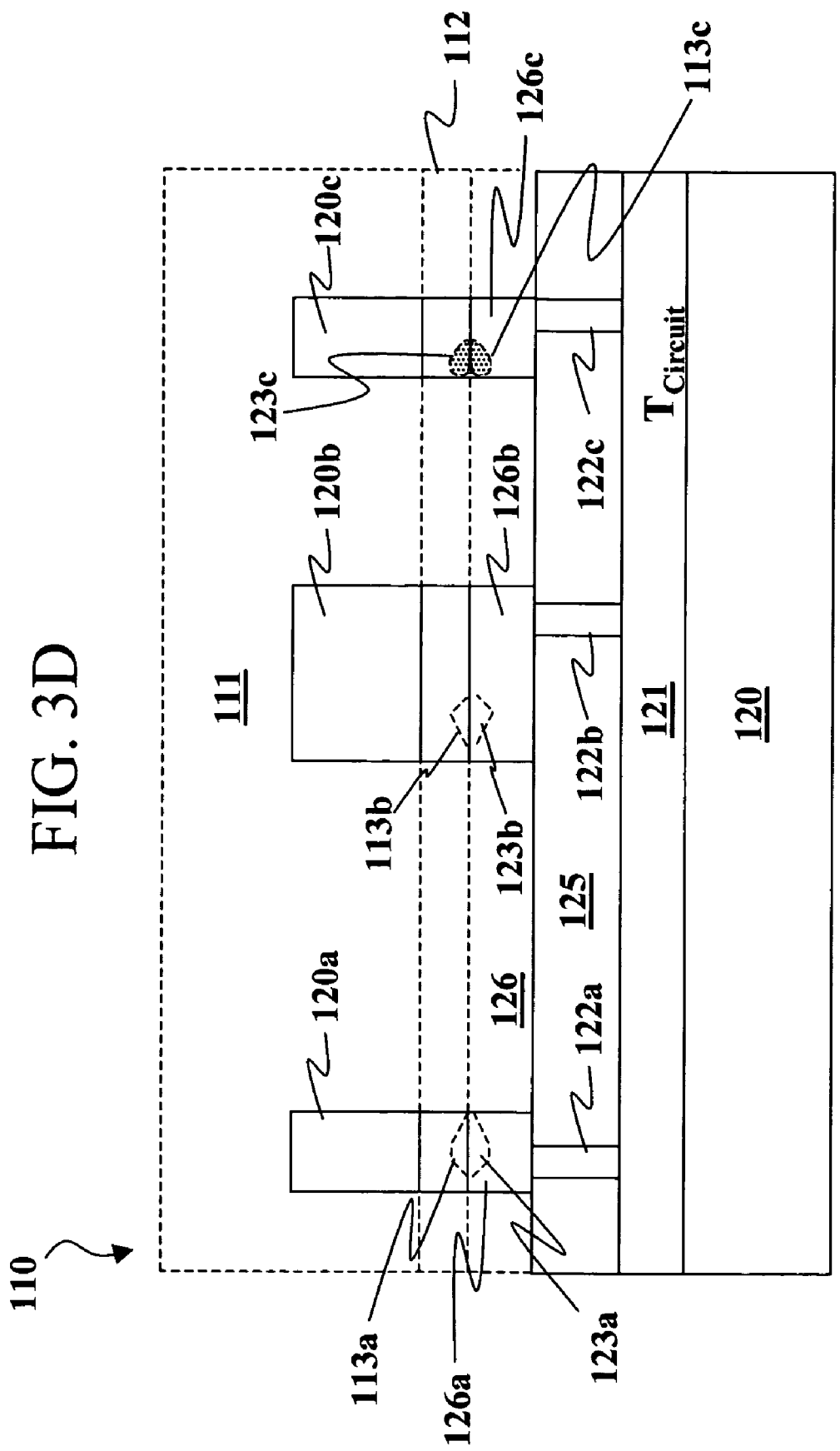

WAFER BONDING METHOD

CROSS REFERENCE TO RELATED APPLICATIONS

This is a continuation-in-part of application Ser. No. 10/873,969, entitled "THREE-DIMENSIONAL INTEGRATED CIRCUIT STRUCTURE AND METHOD OF MAKING SAME", filed 21 Jun. 2004 now U.S. Pat. No. 7,052,941; and which is incorporated in its entirety herein by reference.

BACKGROUND OF THE INVENTION

1. Field of the Invention

The present invention relates generally to semiconductors and, more particularly, to forming circuitry using wafer bonding.

2. Description of the Related Art

Advances in semiconductor manufacturing technology have provided computer systems with integrated circuits that include many millions of active and passive electronic devices, along with the interconnects to provide the desired circuit connections. A typical computer system includes a computer chip, with processor and control circuits, and an external memory chip. As is well-known, most integrated circuits include laterally oriented active and passive electronic devices that are carried on a single major surface of a substrate. Active devices typically include transistors and passive devices typically include resistors, capacitors, and inductors. However, these laterally oriented devices consume significant amounts of chip area.

It is desirable to provide computer chips that can operate faster so that they can process more data in a given amount of time. The speed of operation of a computer chip is typically measured in the number of instructions in a given amount of time it can perform. Computer chips can be made to process more data in a given amount of time in several ways. For example, they can be made faster by decreasing the time it takes to perform certain tasks, such as storing and retrieving information to and from the memory chip. The time needed to store and retrieve information to and from the memory chip can be decreased by embedding the memory devices included therein with the computer chip. This can be done by positioning the memory devices on the same surface as the other devices carried by the substrate.

However, there are several problems with doing this. One problem is that the masks used to fabricate the memory devices are not compatible with the masks used to fabricate the other devices on the computer chip. Hence, it is more complex and expensive to fabricate a computer chip with memory embedded in this way. Another problem is that memory devices tend to be large and occupy a significant amount of area. Hence, if most of the area on the computer chip is occupied by memory devices, then there is less area for the other devices. Further, the yield of the computer chips fabricated in a run decreases as their area increases, which increases the overall cost.

Instead of embedding the memory devices on the same surface as the other devices, the memory chip can be bonded to the computer chip, as in a 3-D package or a 3-D integrated circuit (IC). Conventional 3-D packages and 3-D ICs both include a substrate with a memory circuit bonded to it by a bonding region positioned therebetween. The memory chip typically includes lateral memory devices which are prefabricated before the bonding takes place. In both the 3-D package and 3-D ICs, the memory and computer chips include large bonding pads coupled to their respective circuits. However, in the 3-D package, the bonding pads are connected together using wire bonds so that the memory and computer chips can communicate with each other. In the 3-D IC, the bonding pads are connected together using conductive interconnects which extend therebetween. There are several problems, however, with using 3-D packages and 3-D ICs.

One problem is that the use of wire bonds increases the access time between the computer and memory chips because the impedance of wire bonds and large contact pads is high. The contact pads are large in 3-D packages to make it easier to attach the wire bonds thereto. Similarly, the contact pads in 3-D ICs have correspondingly large capacitances which also increase the access time between the processor and memory circuits. The contact pads are large in 3-D ICs to make the alignment between the computer and memory chips easier. These chips need to be properly aligned with each other and the interconnects because the memory devices carried by the memory chip and the electronic devices carried by the computer chip are prefabricated before the bonding takes place.

Another problem with using 3-D packages and 3-D ICs is cost. The use of wire bonds is expensive because it is difficult to attach them between the processor and memory circuits and requires expensive equipment. Further, it requires expensive equipment to align the various devices in the 3-D IC. The bonding and alignment is made even more difficult and expensive because of the trend to scale devices to smaller dimensions.

Accordingly, it is highly desirable to provide a new method for embedding memory devices using wafer bonding which is cost effective and reliable.

BRIEF SUMMARY OF THE INVENTION

The present invention provides a method of coupling substrates together which includes providing a first substrate; providing a second substrate with a conductive bonding region coupled to it; providing heat to the conductive bonding region to reduce its number of defects; and bonding the surface of the conductive bonding region to the first substrate so that the conductive bonding region and the first substrate are coupled together.

The present invention also provides a method of coupling substrates together including providing first and second substrates, at least one of the first and second substrates having a conductive bonding region formed thereon; providing heat to reflow the surface of at least one conductive bonding region to planarize it; and coupling the first and second substrates together with the conductive bonding region(s).

The present invention further provides a method of forming a circuit providing first and second substrates, each having metal bonding regions formed thereon; heating at least one of the metal bonding regions to reflow its corresponding bonding surface; and forming a metal-to-metal bond between the bonding surfaces of the metal bonding regions so that the first and second substrates are coupled together.

These and other features, aspects, and advantages of the present invention will become better understood with reference to the following drawings, description, and claims.

BRIEF DESCRIPTION OF THE DRAWINGS

FIGS. 1A-1F are simplified sectional views of a method of fabricating a circuit in accordance with the present invention;

FIGS. 2A-2F are simplified sectional views of another method of fabricating a circuit in accordance with the present invention; and FIGS. 3A-3D are simplified sectional views of still another method of fabricating a circuit in accordance with the present invention.

DETAILED DESCRIPTION OF THE INVENTION

Figure 1A:
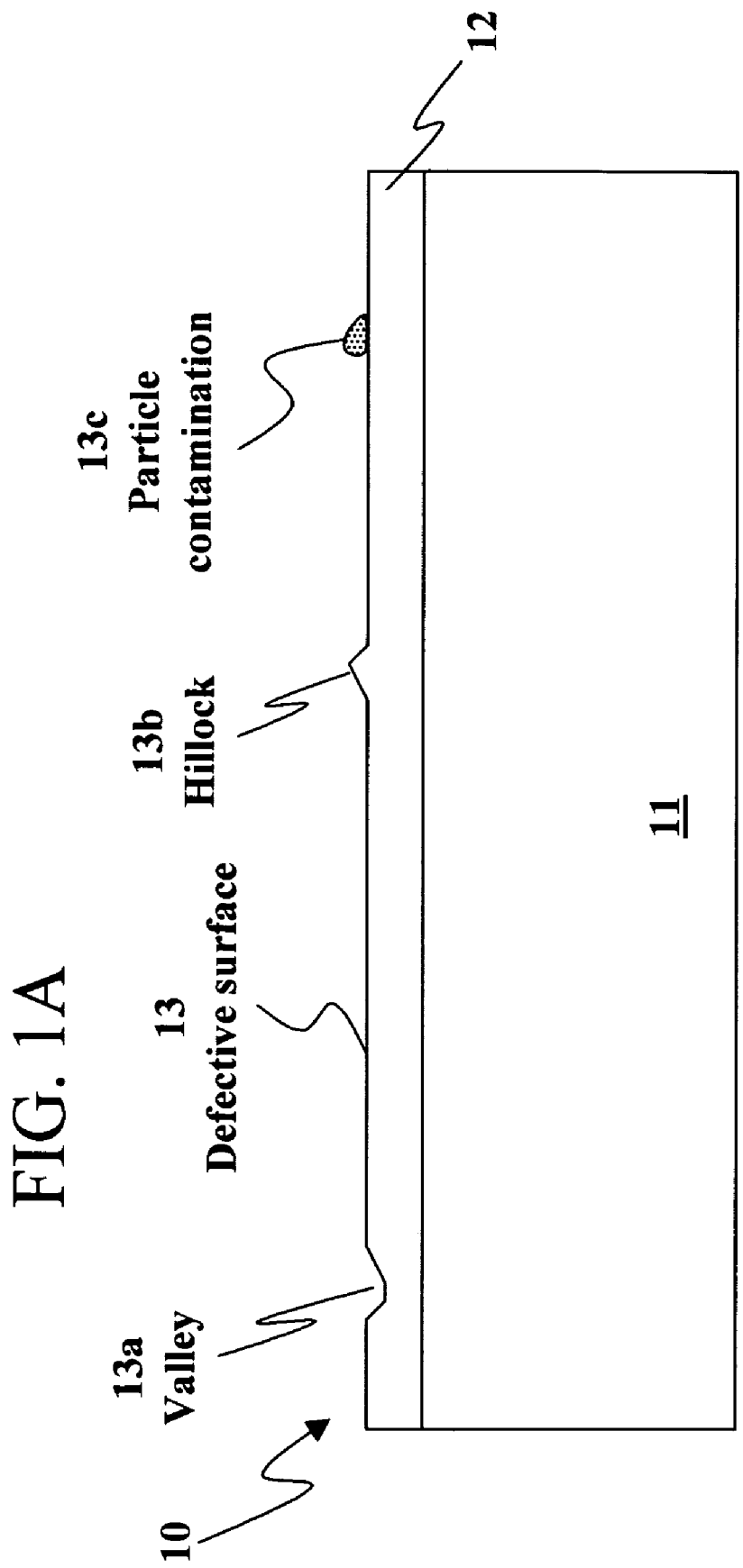

FIGS. 1A-1F are simplified sectional views of steps in fabricating a circuit 10 in accordance with the present invention. It should be noted that in the following figures, like reference characters indicate corresponding elements throughout the several views. Circuit 10 is formed using a wafer bonding method which has several advantages. One advantage is that the wafers can be more strongly bonded together because the method reduces the number of defects on the bonding surfaces. There are fewer defects on the bonding surfaces because one or more of the bonding surfaces is reflowed at a high reflow temperature so the number of defects is reduced. The defects can form microvoids between the bonding surfaces when the wafers are coupled together. Microvoids are regions of missing material formed between the two bonding surfaces when they are coupled together. Since the bond strength increases with the contact area between the two bonding surfaces, fewer microvoids indicate a stronger bond.

Another advantage of this wafer bonding method is that the number of electronic devices which can be formed is increased. Typically, one of the bonded wafers is etched to form electronic devices which are bonded to the surface of the other wafer. Hence, the presence of defects on this surface can cause toppling or adhesion problems with these electronic devices. If an electronic device topples over or does not properly adhere to the bonding surface, then this surface area is wasted because the device will not function properly.

Another advantage is that the wafer bonding method allows the wafers to be coupled together without negatively impacting the electrical properties of either of the wafers. The bonding method also allows the wafers to be coupled together without negatively impacting the performance of any circuitry carried by either of the wafers. One reason the electrical properties and/or performance of the circuitry can be negatively impacted is because the high reflow temperature can cause unwanted diffusion of dopants or materials included therein.

In accordance with the invention, the degradation of the electrical properties and/or performance of the circuit is reduced because the circuit's temperature is controlled. The circuit's temperature is controlled by providing the heat to reflow the surface at the reflow temperature for a short period of time. In this way, the temperature of the circuitry will not increase by too much because the heat will not have enough time to flow to it. The heat to bond the surfaces together is provided for a longer period of time, but it has a lower energy so that the temperature of the circuit is not increased to where its electrical properties and/or performance would be significantly degraded.

Heating up the circuitry too much can decrease its reliability because the devices included therein can be adversely affected by the heat. For example, at high temperatures, conductive interconnect lines can melt and/or react with other elements to become more insulating so that their series resistance undesirably changes. Further, conductive contacts can cause junction spikes which form when material from the conductive contacts diffuses through an adjacent semiconductor region because of an increase in temperature. The material from the conductive contacts can negatively impact the electrical properties of the semiconductor region it diffuses into by undesirably changing its conductivity.

Too much heat can also adversely affect any doped regions included in the electronic devices, such as the regions which form a pn junction. This is because too much heat can cause the dopants to undesirably diffuse to other regions of the device. This unwanted diffusion of the dopants can negatively impact the circuitry's reliability and/or performance parameters by changing the conductivity of the doped regions included therein. Typical performance parameters which can be affected include the gain, reverse leakage current, and turn-on voltage, among others.

In some embodiments, it may be desired to perform the reflow and bonding in an inert gas environment because the bonding surface can be oxidized at elevated temperatures. As a result, the oxidized bonding surface may have a high resistance which undesirably attenuates electrical signals flowing therethrough. Suitable inert gases can include argon (Ar), nitrogen (N), or another gas which does not substantially react with the material included in the bonding surface. If the processing is performed without the inert gas environment and the bonding surface is oxidized, then its surface can be etched by plasma etching or cleaned with a chemical solution, for example, to remove the oxidation.

In FIG. 1A, partially fabricated circuit 10 includes a substrate 11 with a conductive bonding region 12 coupled thereto. Conductive bonding region 12 generally includes a defective surface 13 which can be defective for a number of reasons. One reason is that in conventional deposition methods, the material included in conductive bonding region 12 is generally not evenly deposited which can create valleys 13a and/or hillocks 13b adjacent to surface 13. Another reason is that in conventional deposition methods, particle contamination 13c can be inadvertently deposited adjacent to surface 13. Particle contamination can include particles from various materials, such as semiconductors, metals, and/or insulators which can be deposited during subsequent processing. For example, if surface 13 is chemical mechanically polished, then a slurry of material contaminants can be undesirably deposited thereon.

As discussed in more detail below, it is typically desired to bond surface 13 to another surface. Accordingly, the presence of valleys 13a, hillocks 13b, and/or contamination 13c can cause microvoids to form between surface 13 and the other surface. The microvoids can cause toppling and/or missing devices. Also, these defects can reduce the bond strength between surface 13 and the other surface. As a result, it is desired to reduce the presence of these defects so that fewer microvoids are formed.

In accordance with the invention, surface 13 is reflowed by heating it up so that the material included in region 12 moves into valley 13a and away from hillock 13b so that these defects are reduced or removed. The heat can also cause contamination 13c to desorb from surface 13. In this way, the defects in surface 13 are reduced so that fewer microvoids are formed when it is bonded to the other surface. The reduction in the number of defects also increases the reliability of circuit 10 because the bond is more likely to remain strong for a longer period of time during subsequent wafer processing steps, such as patterning, etching, cleaning, etc.

The bond is also more likely to remain strong through the temperature cycles of circuit 10 which it is frequently subjected to during normal operation. The temperature cycles can be from turning the circuit on and off, or from having the circuit go from a state of performing many operations to an idle state. The temperature of the circuit is higher when it is turned on and performing many operations and it is lower when the circuit is turned off or in an idle state. Accordingly, the temperature of a typical circuit can fluctuate in a temperature range of several hundred degrees Fahrenheit and if the bond is not strong, then the circuit can perform poorly and/or fail.

The other surface bonded to surface 13 typically includes a metal so that surface 13 and the other surface form a metal-to-metal bond. The metal-to-metal bond is thought to form because of the interaction between the electrons of the two metals. The very highest quality metal-to-metal bond is a thermal bond, where the parameters which determine the bond strength of a thermal bond are typically force or pressure, temperature, and time. The force or pressure applied to the two surfaces to be bonded is high enough to ensure intimate contact. The time required is dependent on the temperature, with higher temperatures being associated with lower times.

The bond strength of metal-to-metal bonds increases with the contact area between the two bonding surfaces. Accordingly, valleys 13a, hillocks 13b and/or contamination 13c reduce the bond strength because their presence reduces the contact area between the two bonding surfaces. One reason the contact area is reduced is because the presence of these defects causes microvoids to form between surface 13 and the other surface when they are coupled together. As discussed above, microvoids are regions of missing material formed between the bonding surfaces.

Figure 1B:
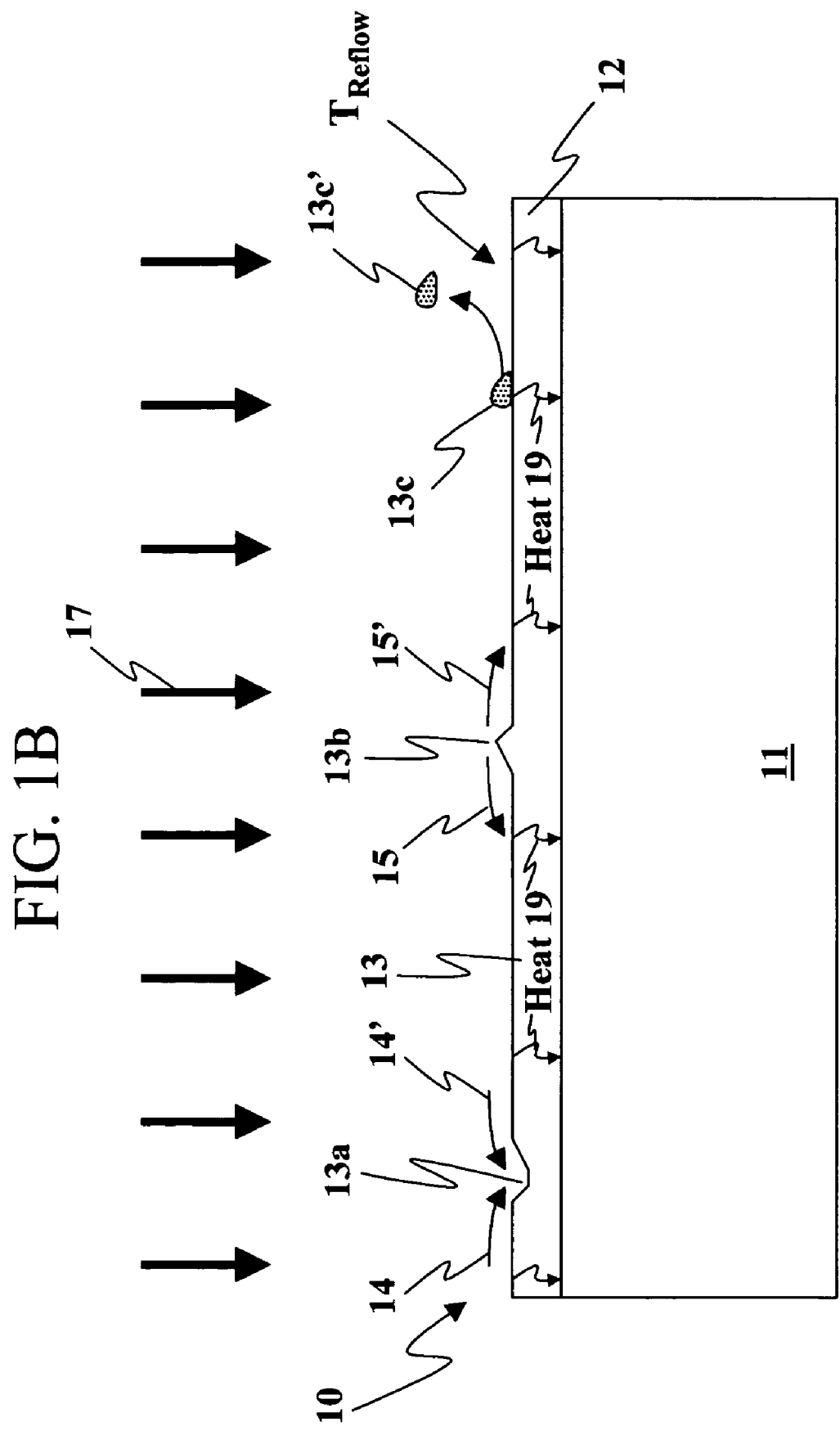

Surface 13 can be reflowed in many different ways. In FIG. 1B, light 17 is provided to conductive bonding region 12 to reflow surface 13 by heating it up to reflow temperature $T_{Reflow}$ to reduce its number of defects. Light 17 can be provided by various light sources, such as a white light source or a laser. Accordingly, the light can be coherent or incoherent and its frequency spectrum can be narrow or broad as long as it can provide the desired amount of heat to reflow surface 13. In one embodiment, light 17 has a wavelength spectrum chosen so that it is absorbed near surface 13. Suitable wavelength spectrums include the visible or infrared spectrums of light, although other spectrums may be suitable. In this way, light 17 causes the temperature of region 12 to increase to temperature $T_{Reflow}$ by providing heat 19. If $T_{Reflow}$ is chosen to be high enough, then material 14 and 14' of region 12 can diffuse into valley 13a and material 15 and 15' in hillock 13b can diffuse away from hillock 13b. Further, particle contamination 13c can desorb from surface 13 as desorption particle 13c'.

The removal of one or more of these defects provides a reflow surface 16 as shown in FIG. 1C. Reflow surface 16 has fewer defects than surface 13 and, consequently, is more likely to form a stronger and more reliable bond with the other surface it is bonded to. In FIG. 1C, valley 13a, hillock 13b, and particle contamination 13c are shown in phantom with dotted lines for reference purposes to indicate their location if surface 13 had not been reflowed to provide reflow surface 16.

Temperature $T_{Reflow}$ substantially depends on the material included in region 12. For example, aluminum (Al) has a melting temperature of about 670° C. so $T_{Reflow}$ should be in a range from about 600° C. to 700° C. if region 12 includes aluminum. Region 12 can also include alloys, such as an aluminum alloy with a reflow temperature between about 200° C. to 650° C., a zinc alloy with a reflow temperature between about 380° C. to 484° C., or a tin alloy with a reflow temperature between about 220° C. to 420° C. It should be noted, however, that the reflow temperature can be outside of these ranges and will substantially depend on the material(s) included in region 12.

In FIG. 1D, a substrate 20 is provided which, in this embodiment, includes a circuit 21 positioned thereon. Circuit 21 can include electronic devices, such as transistors, resistors, capacitors, and/or inductors, among others. An interlayer dielectric region (ILD) 25 is positioned on circuit 21. Conductive interconnects 22a, 22b, and 22c are coupled to circuit 21 and extend through region 25 and to a bonding surface 23 of region 25. Interconnects 22a, 22b, and 22c are typically coupled to different electronic devices (not shown) in circuit 21 so that they each communicate different electrical signals, although this is not essential. Region 25 has a lower conductivity than interconnects 22a-22c so that it behaves as an insulator.

The electronic circuitry included in circuit 21 can be coupled together to operate as analog and/or digital circuitry and interconnects 22a, 22b, and 22c can include conductive vias. It should be noted that substrate 20 is shown as a single layer with circuit 21 positioned thereon for simplicity and ease of discussion. However, it would be appreciated by one skilled in the art that substrate 20, dielectric region 25, and/or circuit 21 can each include layers of materials.

Here, a region 18 is heated to a temperature $T_{Bond}$ at which it is desired to bond surface 16 to surface 23. Region 18 can include region 12 and a portion of substrate 11 proximate to region 12. Region 18 is heated up by providing heat 17' to region 12. Heat 17' can be provided to region 12 by a light source, such as a laser and/or a conventional heater, such as a heating chuck. Heat 17' can also be provided to surface 23 by the light source and/or conventional heater. If heat 17' is provided by a light source, then the light should have a wavelength spectrum chosen so that it is absorbed near surface 16 and 23. A suitable wavelength spectrum for most materials included in regions 12 and 25 includes the visible or infrared spectrums of light. Conventional heaters typically provide heat that has a longer wavelength spectrum than visible light, such as infrared light. In an alternative embodiment, however, the heat provided to surface 23 can be from heat 17' reradiated from surface 16 instead of from heat 17'. In any of these embodiments, different amounts of heat can be provided to surfaces 16 and 23, with the amount of heat depending on the materials proximate to surfaces 16 and 23.

$T_{Bond}$ is chosen to be a temperature less than $T_{Reflow}$ so that the temperature of circuit 21, denoted as $T_{Circuit}$, is not increased by too much. If $T_{Circuit}$ is increased by too much, then the various devices included therein can experience performance degradation and have reliability issues, as discussed above. $T_{Bond}$ can be adjusted in a number of different ways. For example, $T_{Bond}$ can be adjusted by choosing the intensity and/or frequency of heat 17'. $T_{Bond}$ can also be adjusted by directing heat from the heat source to region 18 without adversely increasing $T_{Circuit}$. $T_{Bond}$ can also be chosen by using a combination of heat from the light source and the heater.

It should be noted that in some embodiments, a metallic region can be positioned on surface 23. However, surface 23 is shown as being the surface of ILD layer 25 for simplicity. Other examples of bonding surfaces are disclosed in a co-pending U.S. patent application Ser. No. 11/092,501 titled "SEMICONDUCTOR BONDING AND LAYER TRANSFER METHOD," filed on an even date herewith by the same inventor and incorporated herein by reference. if a metallic region is positioned on surface 23, then it can include the same metal as region 12 or it can include a different metal. The choice of metals in these regions substantially depends on the desired bonding properties between them. In FIG. 1E, surfaces 16 and 23 are positioned adjacent to each other and the heat is removed after a predetermined time so that substrates 11 and 20 are coupled together.

In FIG. 1F, portions of substrate 11 and region 12 are removed to form devices 20a, 20b, and 20c which are coupled to respective interconnects 22a, 22b, and 22c through conductive contacts 12a, 12b, and 12c, respectively. The portions of region 12 which are not removed are contacts 12a-12c. The portions of substrate 11 and region 12 which are removed are shown in phantom. Devices 20a, 20b, and 20c can include any electronic devices, such as semiconductor memory, image sensors, capacitors, and/or transistors, among others. In one particular example, the electronic devices included in devices 20a, 20b, and 20c can operate as static or dynamic random access memory. Further, devices 20a, 20b, and 20c can include layers of semiconductor material, which are not shown for simplicity and ease of discussion. More information as to the electronic devices can be found in co-pending U.S. patent application Ser. No. 11/092,500 titled "SEMICONDUCTOR MEMORY DEVICE" and U.S. patent application Ser. No. 11/092,521 "ELECTRONIC CIRCUIT WITH EMBEDDED MEMORY," both filed on an even date herewith by the same inventor and incorporated herein by reference.

As can be seen in FIG. 1F, if valley 13a, hillock 13b, and contamination 13c where still present in region 12, then the adhesion of conductive contacts 12a, 12b, and/or 12c to respective interconnects 22a, 22b, and 22c can be negatively affected. If the adhesion is poor, then devices 20a, 20b, and 20c would be weakly bonded to surface 23 since they are bonded thereto through corresponding interconnects 12a, 12b, and 12c. This can negatively affect the yield, reliability, and/or performance of circuit 10. The yield can be negatively affected because the probability that devices 12a, 12b, and/or 12c would not adhere to corresponding interconnects 22a, 22b, and 22c would increase. The reliability would be negatively impacted because, during operation of circuit 10, devices 20a, 20b, and/or 20c can topple over. Further, the performance can decrease because the series resistance between contacts 12a, 12b, and/or 12c and corresponding interconnects 22a, 22b, and 22c can increase. An increased series resistance decreases the amplitude of signals flowing therethrough, which makes these signals noisier.

Figure 2B:
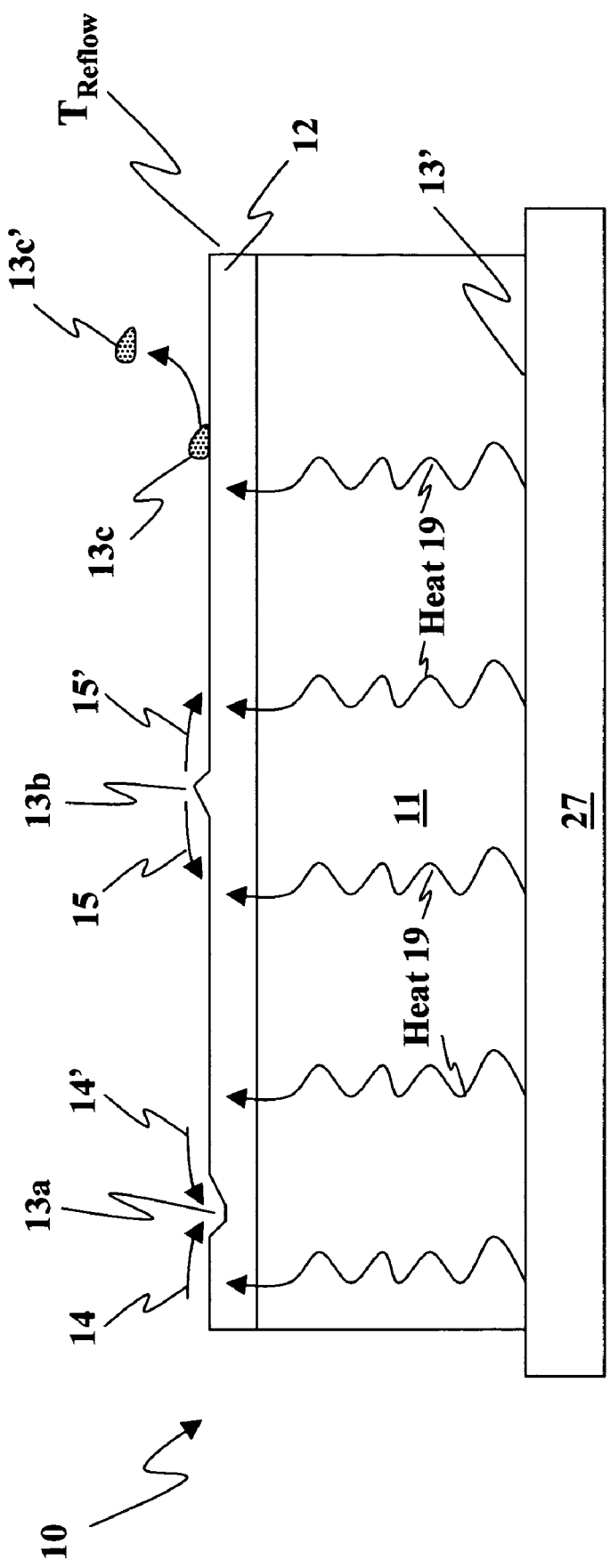

FIGS. 2A-2F shows several steps in another method of fabricating circuit 10. In this embodiment, substrate 11 is provided with region 12 positioned thereon. Region 12 has defective surface 13 with valleys 13a, hillocks 13b, and/or particle contamination 13c, as described above in conjunction with FIG. 1A. In FIG. 2A, a heater 27 carries partially fabricated circuit 10. In this particular example, heater 27 is positioned so that it supports substrate 11 on a surface 13' positioned opposite to region 12 and surface 13. Heater 27 can include a heating chuck or another heating element well known to those skilled in the art.

In FIG. 2B, heater 27 provides heat 19 which flows through substrate 11 and region 12 to heat up surface 13 to its reflow temperature $T_{Reflow}$. In response, surface 13 is reflowed so that material 14 and 14' of region 12 diffuses into valley 13a and material 15 and 15' of hillock 13b diffuses away from hillock 13b. Further, particle contamination 13c can desorb from surface 13 as desorption particle 13c' to provide reflow surface 16 as shown in FIG. 2C. In FIG. 2C, valley 13a, hillock 13b, and particle contamination 13c are shown in phantom with dotted lines to indicate their location if surface 13 had not been reflowed.

Figure 2D:
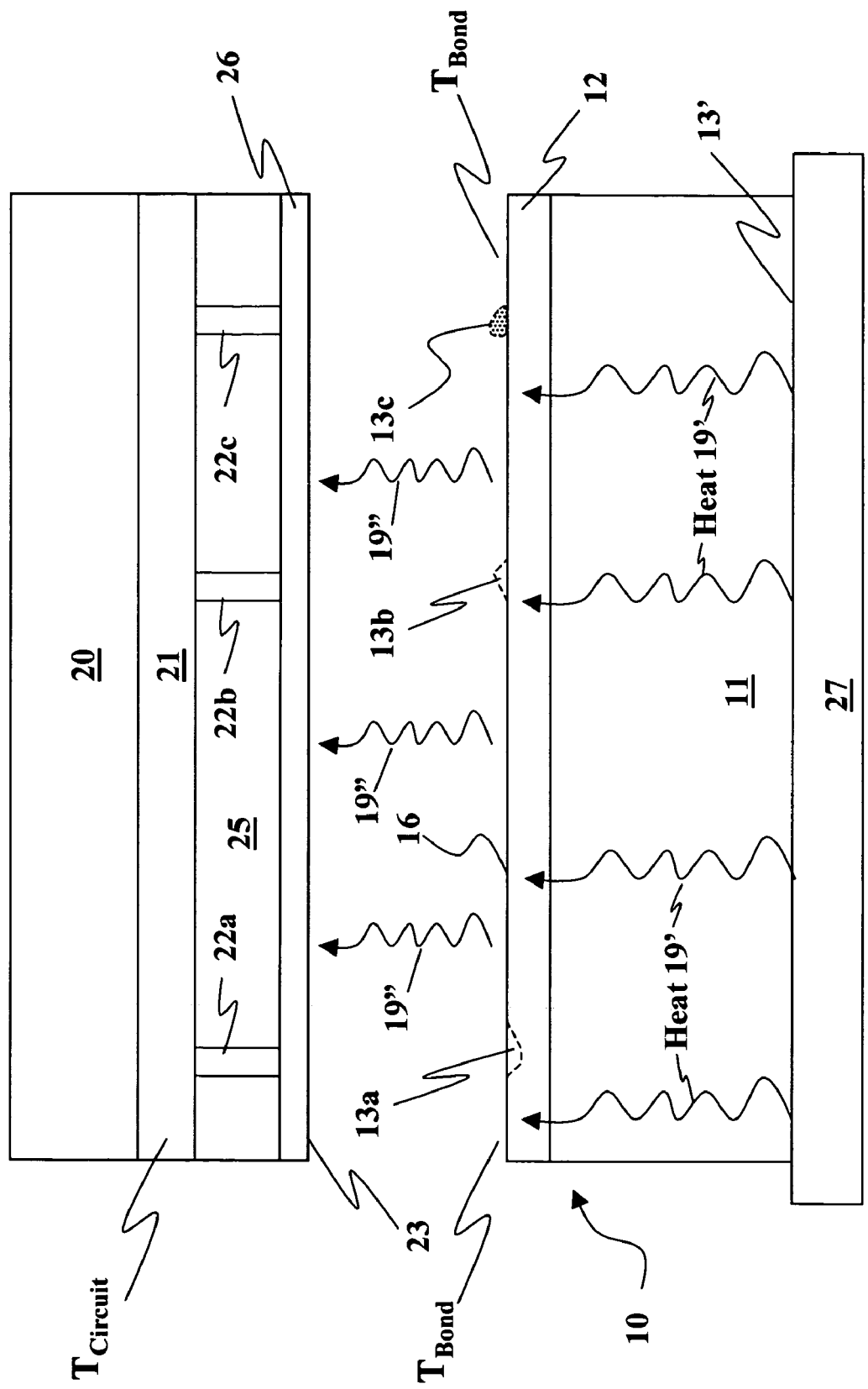

In FIG. 2D, substrate 20 is provided which includes circuit 21 positioned thereon. In some embodiments, circuit 21 can include multiple vertical impurity junctions either with or without circuit patterns. In other embodiments, circuit 21 can include other circuitry well-known to those skilled in the art. Interlayer dielectric region 25 is positioned on circuit 21. Conductive interconnects 22a, 22b, and 22c are coupled to circuit 21 and extend through region 25 where they contact a conductive region 26 positioned on ILD region 25. In this step, heater 27 outputs heat 19' which has less energy than heat 19 outputted in FIGS. 2A and 2B. In response, surface 16 is provided with temperature $T_{bond}$. A portion of heat 19', denoted as heat 19", is reradiated towards surface 23 where it is incident to it. In this embodiment, surface 23 is the surface of region 26 opposite region 25.

Figure 2E:
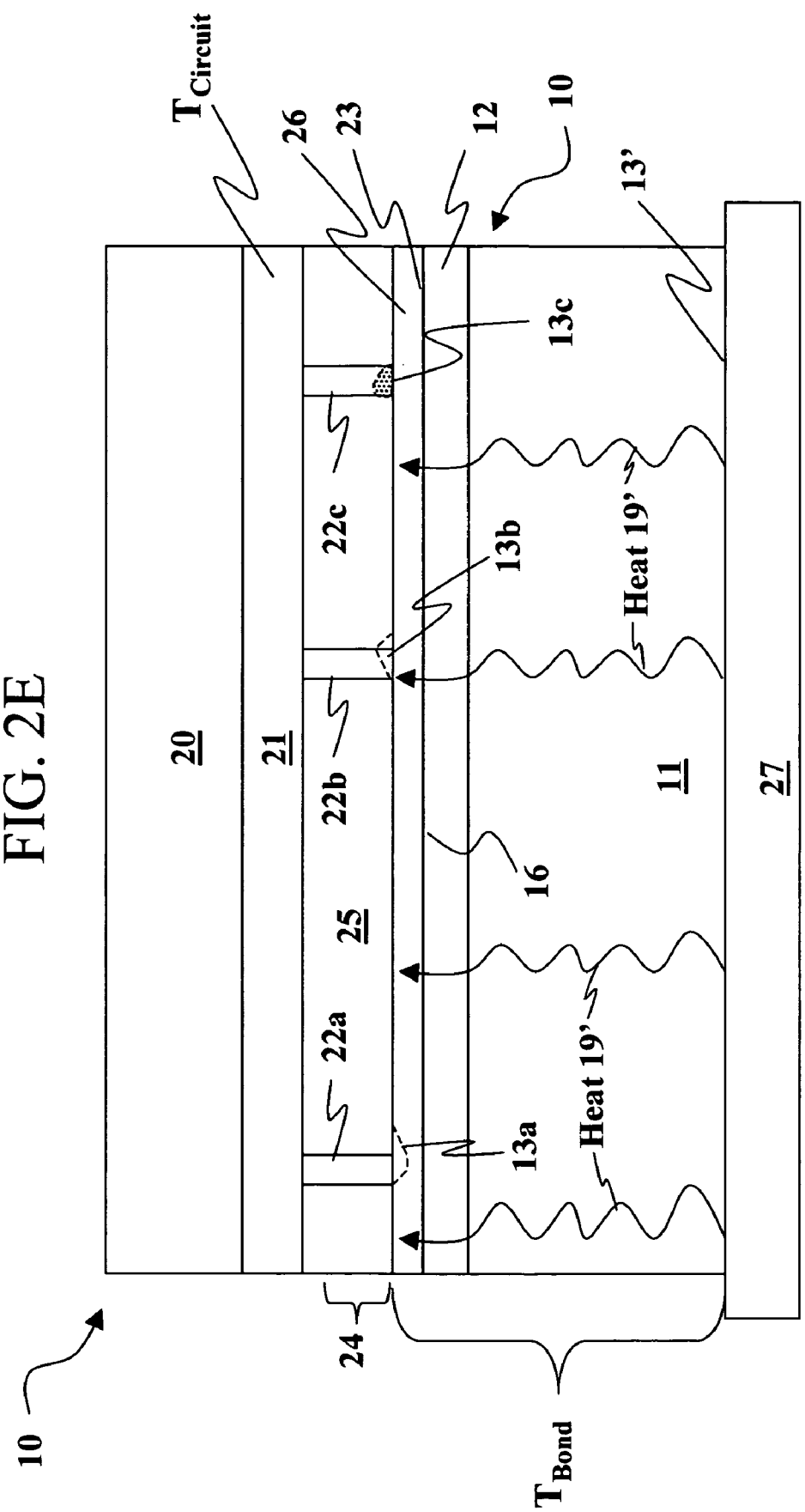

In FIG. 2E, surfaces 16 and 23 are positioned together, as shown, so that heat 19' flows into a region 24 which can extend into region 25. Temperature $T_{Bond}$ should be high enough so that regions 12 and 26 are bonded together, but it should also be low enough so that heat 19' does not increase $T_{Circuit}$ to a temperature which negatively impacts the performance and/or reliability of the electronic devices included in circuit 21. $T_{Bond}$ can be adjusted by adjusting the heat output of heater 27. In FIG. 2E, surfaces 16 and 23 are bonded together and heat 19' is removed after a predetermined time so that substrates 11 and 20 are coupled together.

Figure 2F:
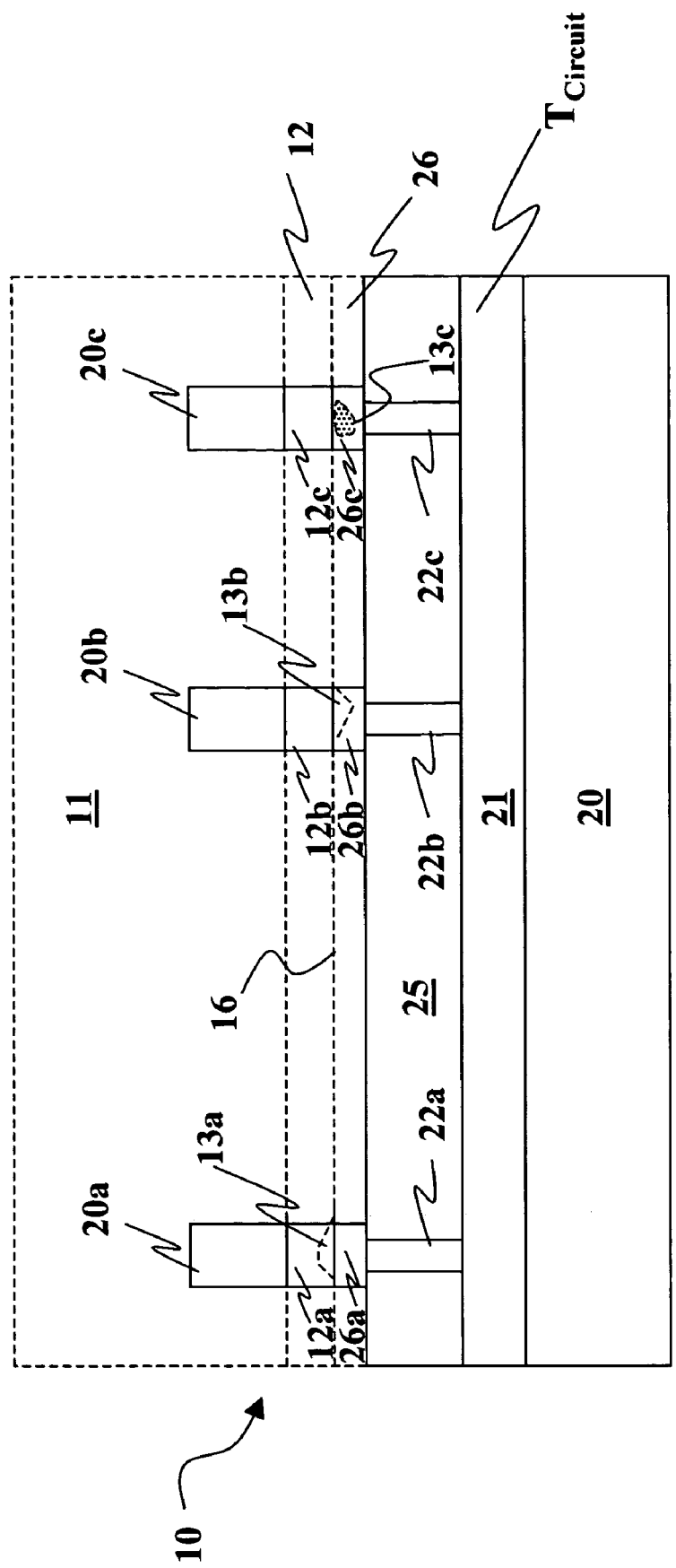

In FIG. 2F, portions of substrate 11 and regions 12 and 26 are removed to form devices 20a, 20b, and 20c which are coupled to respective contacts 26a, 26b, and 26c through contacts 12a, 12b, and 12c, respectively. Contacts 26a-26c are the portions of region 26 which are not removed. As can be seen in FIG. 2A, if valley 13a, hillock 13b, and contamination 13c where still present in region 12, then devices 20a, 20b, and 20c would be weakly bonded to surface 23. This can negatively affect the yield and reliability of devices circuit 10, as discussed in more detail above in conjunction with FIG. 1F.

Figure 3B:
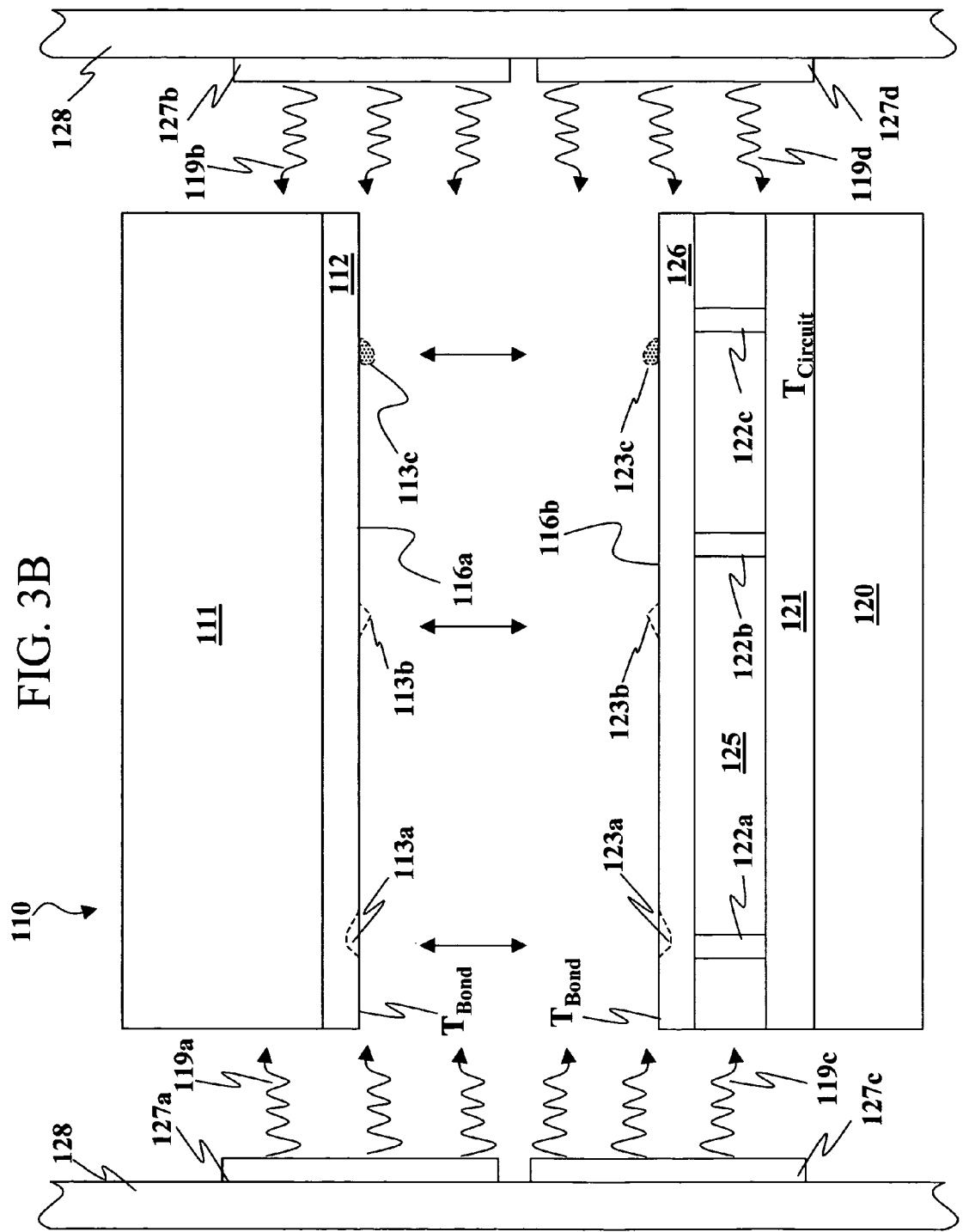

FIGS. 3A-3D show several steps in a method of fabricating a circuit 110. It should be noted that in the following discussion, similar elements to those discussed above are denoted with like reference characters with a '1' in front. In FIG. 3A, partially fabricated circuit 110 includes a substrate 120 which carries a circuit 121. An interlayer dielectric region 125 is positioned on circuit 121. Conductive interconnects 122a, 122b, and 122c are coupled to circuit 121 and extend through region 125 where they couple to a conductive region 126 positioned on region 125. Region 126 has defective surface 123 which typically includes valleys 123a, hillocks 123b, and/or particle contamination 123c. A substrate 111 is provided with a conductive region 112 positioned thereon. Region 112 has defective surface 113 which typically includes valleys 113a, hillocks 113b, and/or particle contamination 113c.

In FIG. 3A, heating elements 127a and 127b are positioned proximate to conductive region 112 and heating elements 127c and 127d are positioned proximate to conductive region 126. In this embodiments, heating elements 127a-127d are positioned on a chamber wall 128 of a wafer bonding machine. However, this is not essential because heating elements 127a-127d can be positioned elsewhere as long as they can sufficiently heat corresponding regions 112 and 126. Heating elements 127a and 127b provide heat 119a and 119b. Similarly, heating elements 127c and 127d provide heat 119c and 119d, respectively. In this way, the corresponding heating elements heat surfaces 113 and 123 to temperature $T_{Reflow}$.

Heat 119c and 119d should be provided so that the temperature of circuit 121, denoted as $T_{Circuit}$, does not increase to a value which negatively impacts the performance and/or reliability of the devices included therein. One way to do this is to provide heat 119c and 119d for a period of time which allows surface 123 to be reflowed, but which does not allow $T_{circuit}$ to increase by too much. Heat 119a and 119b can be provided for the same amount of time as heat 119c and 119d or it can be provided for another period of time. However, heat 119a and 119b should also be provided so that it reflows surface 112, but does not increase $T_{Circuit}$ by too much. Heat 119a and 119b can affect $T_{Circuit}$ because this heat can be reradiated by region 112 towards circuit 121.

In response to the increase in temperature, surface 123 is reflowed so that material 114b and 114b' of region 126 diffuses into valley 123a and material 115b and 115b' of hillock 123b diffuses away from hillock 123b. Further, particle contamination 123c can desorb from surface 123 as desorption particle 123c' to provide a reflow surface 116b, as shown in FIG. 3B. Valley 123a, hillock 123b, and particle contamination 123c are shown in phantom with dotted lines in FIG. 3B to indicate their location if surface 123 had not been reflowed.

Similarly, in response to the increase in temperature, surface 113 is reflowed so that material 114a and 114a' of region 112 diffuses into valley 113a and material 115a and 115a' of hillock 113b diffuses away from hillock 113b. Further, particle contamination 113c can desorb from surface 113 as desorption particle 113c' to provide a reflow surface 116a, as shown in FIG. 3B. Valleys 113a,123a, hillocks 113b,123b, and particle contamination 113c,123c are shown in phantom with dotted lines in FIG. 3B to indicate their location if surfaces 113 and 123 had not been reflowed. In FIG. 3B, the heat provided by elements 127a-127d is adjusted so that the temperatures of reflowed surfaces 116a and 116b are adjusted to bonding temperature $T_{Bond}$. $T_{Bond}$ can be adjusted by adjusting the energy of the heat outputted by heaters 127a-127d.

Figure 3C:
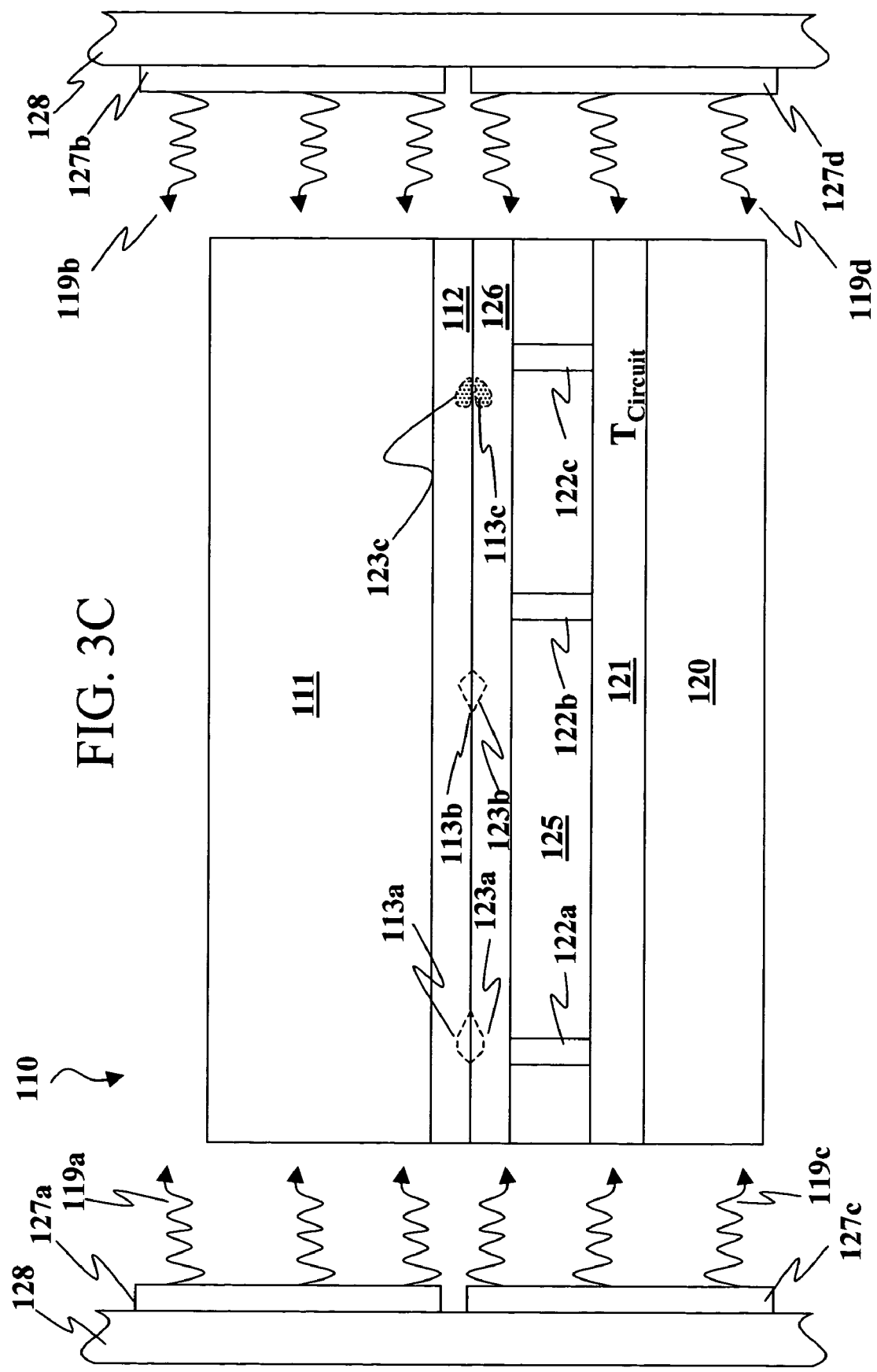

Surfaces 116a and 116b are then positioned adjacent to each other as shown in FIG. 3C. Temperature $T_{Bond}$ should be chosen so that heat 119c and 119d does not increase $T_{Circuit}$ to a temperature which negatively impacts the performance and/or reliability of the devices included in circuit 121. $T_{Bond}$, however, should be high enough so that regions 112 and 126 are bonded together. It should be noted that heaters 127a-127d can provide different amounts of heat with the same or different energies. The amount of heat and its energy outputted by each heater can depend on the material included in regions 112 and 126. If the material included in regions 112 and 126 is the same, then the amount of heat and its energy is typically the same. However, if the material included in regions 112 and 126 is different, then the amount of heat and its energy can be different for each heater or each pair of heaters. For example, heaters 127a and 127b can provide one amount of heat with a particular energy and heaters 127c and 127d can provide a different amount of heat with a different energy.

In FIG. 3D, portions of substrate 111 and regions 112 and 126 are removed to form devices 120a, 120b, and 120c. Portions of region 126 that are not removed are conductive regions 126a, 126b, and 126c which are coupled to conductive interconnects 122a, 122b, and 122c, respectively. Portions of region 112 that are not removed are conductive regions 112a, 112b, and 112c which are positioned on regions 126a, 126b, and 126c, respectively. Devices 120a, 120b, and 120c are positioned on regions 112a, 112b, and 112c, respectively.

As can be seen in FIGS. 3C and 3D, if valleys 113a,123a, hillocks 113b,123b and contamination 113c,123 c where still present on corresponding surfaces 113 and 123, then regions 112a, 112b, and 112c would be weakly bonded to regions 126a, 126b, and 126c. As a result, devices 120a, 120b, and 120c would also be weakly coupled to respective interconnects 122a, 122b, and 122c. This can negatively affect the yield and reliability of circuit 100, as discussed in more detail above in conjunction with FIGS. 1F and 2F.

The present invention is described above with reference to preferred embodiments. However, those skilled in the art will recognize that changes and modifications may be made in the described embodiments without departing from the nature and scope of the present invention. Various further changes and modifications will readily occur to those skilled in the art. To the extent that such modifications and variations do not depart from the spirit of the invention, they are intended to be included within the scope thereof.

Having fully described the invention in such clear and concise terms as to enable those skilled in the art to understand and practice the same, the invention claimed is:

The invention claimed is:

1. A method of coupling substrates together comprising:
   providing a first substrate;
   providing a second substrate which carries a conductive bonding region;
   providing a first amount of heat for a predetermined amount of time to the conductive bonding region to reduce its number of defects;
   bonding a surface of the conductive bonding region to the first substrate so that the conductive bonding region and the first substrate are coupled together; and
   processing the second substrate to form a vertically oriented semiconductor device.

2. The method of claim 1 wherein the step of providing the first amount of heat to the conductive bonding region includes providing visible light incident to the bonding surface to reflow its surface.

3. The method of claim 1 wherein the energy of the first amount of heat is chosen to increase the temperature of the conductive bonding region to reflow its surface.

4. The method of claim 1 wherein the step of bonding the surface of the conductive bonding region to the first substrate includes providing a second amount of heat to the conductive bonding region, where the energy of the second amount of heat is less than the energy of the first amount of heat.

5. The method of claim 1 wherein the second substrate includes electrical circuitry coupled to the conductive bonding region.

6. The method of claim 5 wherein the predetermined amount of time is chosen so that the temperature of the electrical circuitry is not increased above a predetermined temperature in response to the first amount of heat.

7. The method of claim 5 wherein the step of bonding the surface of the conductive bonding region to the first substrate includes providing a second amount of heat to the conductive bonding region, the second amount of heat being chosen so that the temperature of the electrical circuitry is not increased above a predetermined temperature which will decrease the performance of the electrical circuitry.

8. A method of coupling substrates together comprising:
   providing a first substrate which carries electrical circuitry;
   providing a conductive line connected to the electrical circuitry and extending through an interlayer dielectric region carried by the first substrate;
   providing a second substrate which carries a conductive bonding region;
   providing a first amount of heat for a predetermined amount of time to the conductive bonding region; and
   bonding the conductive bonding region to the interlayer dielectric region so the conductive bonding region is connected to the electrical circuitry through the conductive line.

9. The method of claim 8 further including removing a portion of the second substrate and forming a device therewith, the device being connected to the electrical circuitry through the conductive line.

10. The method of claim 8 wherein the energy of the first amount of heat is chosen to increase the temperature of the first conductive bonding region to reflow its surface.

11. The method of claim 8 wherein the step of bonding the conductive bonding region to the interlayer dielectric region includes providing a second amount of heat to the conductive bonding region, where the energy of the second amount of heat is less than the energy of the first amount of heat.

12. The method of claim 11 wherein the time the second amount of heat is provided is restricted so the temperature of the electrical circuitry is not increased above a predetermined temperature.

13. The method of claim 11 wherein the step of bonding the conductive bonding region to the interlayer dielectric region includes providing a second amount of heat to the conductive bonding region, the energy of the second amount of heat being chosen so the temperature of the electrical circuitry is not increased above a predetermined temperature.

14. A method of coupling substrates together comprising:
providing a first substrate which carries electrical circuitry;
providing an interlayer dielectric region carried by the first substrate;
providing a conductive line connected to the electrical circuitry and extending through the interlayer dielectric region;
providing a second substrate which carries a conductive bonding region;
providing a first amount of heat for a first amount of time to the conductive bonding region;
providing a second amount of heat for a second amount of time to the conductive bonding region and bonding the conductive bonding region to the interlayer dielectric region; and
removing a portion of the second substrate.

15. The method of claim 14 wherein the conductive bonding region is connected to the electrical circuitry through the conductive line.

16. The method of claim 14 wherein the second amount of time is less than the first amount of time.

17. The method of claim 14 wherein the energy of the first amount of heat is chosen to increase the temperature of the conductive bonding region to reflow its surface.

18. The method of claim 14, wherein the energy of the second amount of heat is less than the energy of the first amount of heat.

19. The method of claim 14 wherein the time the second amount of heat is provided is restricted so the temperature of the electrical circuitry is not increased above a predetermined temperature.

20. The method of claim 14, further including processing the portion of the second substrate that is not removed to form a device connected to the electrical circuitry through the conductive line.

21. The method of claim 1 wherein the second substrate is processed to form the vertically oriented semiconductor device after the conductive bonding region and first substrate are coupled together.

22. The method of claim 1 further including processing the conductive bonding region to form a contact.

23. The method of claim 22 wherein the vertically oriented semiconductor device is carried by the contact.

24. The method of claim 22 wherein the first substrate includes a circuit which is in communication with the vertically oriented semiconductor device through the contact.

25. The method of claim 24 further including an interconnect extending between the circuit and contact, wherein the interconnect extends through a dielectric region.

26. The method of claim 8 further including processing the second substrate to form a vertically oriented semiconductor device.

27. The method of claim 26 further including processing the conductive bonding region to form a contact, wherein the contact is connected to the conductive line.

28. The method of claim 27 wherein the vertically oriented semiconductor device is carried by the contact.

29. The method of claim 26 wherein the vertically oriented semiconductor device operates as a memory device.

30. The method of claim 26 wherein the second substrate is processed to form the vertically oriented semiconductor device after the conductive bonding region and interlayer dielectric region are bonded together.

31. The method of claim 14 further including forming a vertically oriented semiconductor device by processing the portion of the second substrate that is not removed.

32. The method of claim 31 further including processing the conductive bonding region to form a contact.

33. The method of claim 32 wherein the vertically oriented semiconductor device is carried by the contact.

34. The method of claim 14 further including processing the second substrate and conductive bonding region to form a vertically oriented semiconductor device carried by a contact.

35. A method of coupling substrates together comprising:
providing a first substrate which carries electrical circuitry;
providing a conductive line and interlayer dielectric region carried by the first substrate, the conductive line being connected to the electrical circuitry and extending through the interlayer dielectric region;
providing a second substrate;
coupling the first and second substrates together by using a conductive bonding region; and
processing the second substrate to form a vertically oriented semiconductor device.

36. The method of claim 35 further including processing the conductive bonding region to form a contact.

37. The method of claim 36 wherein the vertically oriented semiconductor device is carried by the contact.

38. The method of claim 36 wherein the vertically oriented semiconductor device is in communication with the electrical circuitry through the contact and conductive line.

39. The method of claim 35 wherein the second substrate is processed to form the vertically oriented semiconductor device after the first and second substrates are coupled together.

40. The method of claim 35 wherein the contact couples the vertically oriented semiconductor device and conductive line together.

41. The method of claim 35 wherein the step of coupling the first and second substrates together includes forming a bonding interface between the vertically oriented semiconductor device and conductive line.

42. The method of claim 41, wherein the vertically oriented semiconductor device is formed after the bonding interface is formed.

* * * * *